(12) United States Patent
Adachi et al.

(10) Patent No.: US 12,144,121 B2
(45) Date of Patent: Nov. 12, 2024

(54) WIRING SUBSTRATE AND METHOD FOR MANUFACTURING WIRING SUBSTRATE

(71) Applicant: IBIDEN CO., LTD., Gifu (JP)

(72) Inventors: Takema Adachi, Ogaki (JP); Yuji Ikawa, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 17/936,924

(22) Filed: Sep. 30, 2022

(65) Prior Publication Data
US 2023/0113278 A1  Apr. 13, 2023

(30) Foreign Application Priority Data
Oct. 8, 2021 (JP) ................. 2021-166373

(51) Int. Cl.
*H05K 1/02* (2006.01)
*H01L 21/56* (2006.01)
(Continued)

(52) U.S. Cl.
CPC ......... *H05K 3/0032* (2013.01); *H05K 1/0373* (2013.01); *H05K 3/107* (2013.01); *H05K 3/26* (2013.01); *H05K 2203/0353* (2013.01)

(58) Field of Classification Search
CPC ...... H05K 1/02; H05K 1/0222; H05K 1/0251; H05K 1/0274; H05K 1/0298; H05K 1/036; H05K 1/0306; H05K 1/0366; H05K 1/0373; H05K 1/053; H05K 1/111; H05K 1/112; H05K 1/115; H05K 1/116; H05K 1/181; H05K 3/0032; H05K 3/26; H05K 3/46; H05K 3/107; H05K 3/188; H05K 3/421; H05K 3/467; H05K 3/4007; H05K 3/4602; H05K 3/4647; H05K 3/4655; H05K 3/4673; H05K 3/4697; H05K 2203/0353;
(Continued)

(56) References Cited

U.S. PATENT DOCUMENTS 6,225,211 B1 * 5/2001 Tsui ................... H01L 21/7681
257/E21.507
RE40,947 E * 10/2009 Asai ..................... H05K 3/0094
428/209
(Continued)

FOREIGN PATENT DOCUMENTS

WO  WO 2010/004841 A1  1/2010

Primary Examiner — Xiaoliang Chen
(74) Attorney, Agent, or Firm — Oblon, McClelland, Maier & Neustadt, L.L.P.

(57) ABSTRACT

A method for manufacturing a wiring substrate includes forming a second resin insulating layer on a first resin insulating layer such that the second resin insulating layer is in contact with a surface of the first resin insulating layer, irradiating laser upon the second resin insulating layer such that a recess penetrating through the second resin insulating layer and exposing the first resin insulating layer is formed, and forming a conductor layer including conductor material filled in the recess formed through the second resin insulating layer such that the conductor layer is embedded in the second resin insulating layer. The second resin insulating layer are formed on the surface of the first resin insulating layer such that the first resin insulating layer and the second resin insulating layer have different processability with respect to the laser.

20 Claims, 5 Drawing Sheets

(51) Int. Cl.
*H01L 21/78* (2006.01)
*H01L 23/12* (2006.01)
*H01L 23/13* (2006.01)
*H01L 23/528* (2006.01)
*H05K 1/03* (2006.01)
*H05K 1/09* (2006.01)
*H05K 3/00* (2006.01)
*H05K 3/10* (2006.01)
*H05K 3/16* (2006.01)
*H05K 3/18* (2006.01)
*H05K 3/26* (2006.01)
*H05K 3/46* (2006.01)

(58) Field of Classification Search
CPC ........ H05K 1/0296; H05K 1/09; H05K 1/113; H05K 1/183; H05K 1/185; H05K 3/0035; H05K 3/0094; H05K 3/0298; H05K 3/061; H05K 3/16; H05K 3/18; H05K 3/388; H05K 3/4038; H05K 3/4644; H05K 3/4682; H01L 21/56; H01L 21/78; H01L 21/486; H01L 21/561; H01L 21/565; H01L 21/4857; H01L 21/6835; H01L 21/7681; H01L 21/76801; H01L 21/76802; H01L 21/76816; H01L 21/76831; H01L 21/76832; H01L 21/76897; H01L 21/76898; H01L 23/12; H01L 23/13; H01L 23/528; H01L 23/3107; H01L 23/3114; H01L 23/3128; H01L 23/3185; H01L 23/4655; H01L 23/4688; H01L 23/5226; H01L 23/5329; H01L 23/5283; H01L 23/5383; H01L 23/5384; H01L 23/5385; H01L 23/5386; H01L 23/5389; H01L 23/5393; H01L 23/43675; H01L 23/49811; H01L 23/49816; H01L 23/49822; H01L 23/49833; H01L 23/49838; H01L 23/49894; H01L 23/53295; H01L 24/02; H01L 24/03; H01L 24/05; H01L 24/08; H01L 24/09; H01L 24/11; H01L 24/16; H01L 24/17; H01L 24/19; H01L 24/20; H01L 24/24; H01L 24/32; H01L 24/73; H01L 24/82; H01L 24/96; H01L 24/97
USPC ................ 174/50, 251, 255, 250, 262, 264; 427/99.2, 193; 428/161, 195.1, 212, 323, 428/402, 446, 688, 209, 220, 523, 901; 438/624; 257/664, 774; 29/825, 852
See application file for complete search history.

(56) References Cited

U.S. PATENT DOCUMENTS

| | | | |
|---|---|---|---|
| 10,636,743 B2* | 4/2020 | Baek | H01L 23/3114 |
| 10,741,461 B2* | 8/2020 | Kim | H01L 24/82 |
| 11,735,532 B2* | 8/2023 | Kim | H01L 21/565 |
| | | | 257/664 |
| 2006/0068581 A1* | 3/2006 | Kobayashi | H05K 3/0035 |
| | | | 438/622 |
| 2010/0006334 A1 | 1/2010 | Takenaka et al. | |
| 2010/0009150 A1* | 1/2010 | Mitooka | B29C 66/73112 |
| | | | 524/556 |
| 2010/0326709 A1* | 12/2010 | Kawano | H05K 3/421 |
| | | | 174/257 |
| 2012/0189818 A1* | 7/2012 | Hayashi | H05K 3/4655 |
| | | | 428/323 |
| 2012/0189826 A1* | 7/2012 | Hayashi | H01L 23/49894 |
| | | | 428/212 |
| 2013/0187287 A1* | 7/2013 | Park | H01L 21/76831 |
| | | | 257/774 |
| 2014/0251656 A1* | 9/2014 | Ikeda | H05K 1/0373 |
| | | | 174/251 |
| 2014/0311772 A1* | 10/2014 | Mizutani | H05K 3/4602 |
| | | | 174/251 |
| 2015/0037611 A1* | 2/2015 | Nagasawa | H05K 3/4661 |
| | | | 428/688 |
| 2015/0189760 A1* | 7/2015 | Ho | H05K 1/165 |
| | | | 174/251 |
| 2015/0296613 A1* | 10/2015 | Matsui | H05K 1/0306 |
| | | | 174/255 |
| 2016/0020163 A1* | 1/2016 | Shimizu | H05K 1/115 |
| | | | 361/768 |
| 2016/0037629 A1* | 2/2016 | Takahashi | H01L 24/17 |
| | | | 174/257 |
| 2016/0233167 A1* | 8/2016 | Shimizu | H01L 23/5389 |
| 2017/0196096 A1* | 7/2017 | Ishihara | H05K 1/113 |
| 2017/0309558 A1* | 10/2017 | Kajihara | H01L 23/49894 |
| 2019/0198429 A1* | 6/2019 | Kang | H01L 23/34 |
| 2019/0281697 A1* | 9/2019 | Abe | H01L 23/5383 |
| 2020/0083163 A1* | 3/2020 | Kuroyanagi | H01L 24/09 |
| 2020/0083201 A1* | 3/2020 | Suk | H01L 24/09 |
| 2020/0335443 A1* | 10/2020 | Sun Zhou | H01L 21/4857 |
| 2020/0411432 A1* | 12/2020 | Kanbe | H01L 23/49894 |
| 2021/0061998 A1* | 3/2021 | Asanuma | C08L 71/08 |
| 2022/0037261 A1* | 2/2022 | Choi | H01L 23/5383 |
| 2022/0078910 A1* | 3/2022 | Park | H05K 1/116 |
| 2022/0087024 A1* | 3/2022 | Yamada | H05K 1/185 |
| 2022/0141953 A1* | 5/2022 | Jeon | H05K 1/0373 |
| | | | 174/251 |
| 2022/0322525 A1* | 10/2022 | Lee | H05K 3/4007 |
| 2022/0328389 A1* | 10/2022 | Hwang | H01L 24/73 |
| 2022/0346230 A1* | 10/2022 | Seo | H05K 1/0251 |
| 2022/0375840 A1* | 11/2022 | Ory | H01L 24/02 |
| 2023/0080862 A1* | 3/2023 | Choi | H01L 21/76832 |
| | | | 257/758 |
| 2023/0117940 A1* | 4/2023 | Ko | H01L 23/49816 |
| | | | 257/774 |
| 2024/0071990 A1* | 2/2024 | Boo | H01L 23/49838 |

* cited by examiner

WIRING SUBSTRATE AND METHOD FOR MANUFACTURING WIRING SUBSTRATE

CROSS-REFERENCE TO RELATED APPLICATIONS

The present application is based upon and claims the benefit of priority to Japanese Patent Application No. 2021-166373, filed Oct. 8, 2021, the entire contents of which are incorporated herein by reference.

BACKGROUND OF THE INVENTION

Field of the Invention

The present invention relates to a wiring substrate and a method for manufacturing the wiring substrate.

Description of Background Art

International Publication No. 2010/004841 describes a print wiring substrate that includes a first insulating layer, a second insulating layer formed on the first insulating layer, a recess formed in the second insulating layer, and a second conductor circuit formed by filling the recess in the second insulating layer. The entire contents of this publication are incorporated herein by reference.

SUMMARY OF THE INVENTION

According to one aspect, a method for manufacturing a wiring substrate includes forming a second resin insulating layer on a first resin insulating layer such that the second resin insulating layer is in contact with a surface of the first resin insulating layer, irradiating laser upon the second resin insulating layer such that a recess penetrating through the second resin insulating layer and exposing the first resin insulating layer is formed, and forming a conductor layer including conductor material filled in the recess formed through the second resin insulating layer such that the conductor layer is embedded in the second resin insulating layer. The second resin insulating layer are formed on the surface of the first resin insulating layer such that the first resin insulating layer and the second resin insulating layer have different processability with respect to the laser.

According to another aspect, a wiring substrate includes a first resin insulating layer, a second resin insulating layer formed on the first resin insulating layer such that the second resin insulating layer is in contact with a surface of the first resin insulating layer, and a conductor layer including conductor material and formed in the second resin insulating layer such that the conductor layer is embedded in the second resin insulating layer. The second resin insulating layer has a recess penetrating through the second resin insulating layer and exposing the first resin insulating layer at a bottom of the recess such that the recess is filled with the conductor material of the conductor layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Embodiments will now be described with reference to the accompanying drawings, wherein like reference numerals designate corresponding or identical elements throughout the various drawings.

Figure 1:
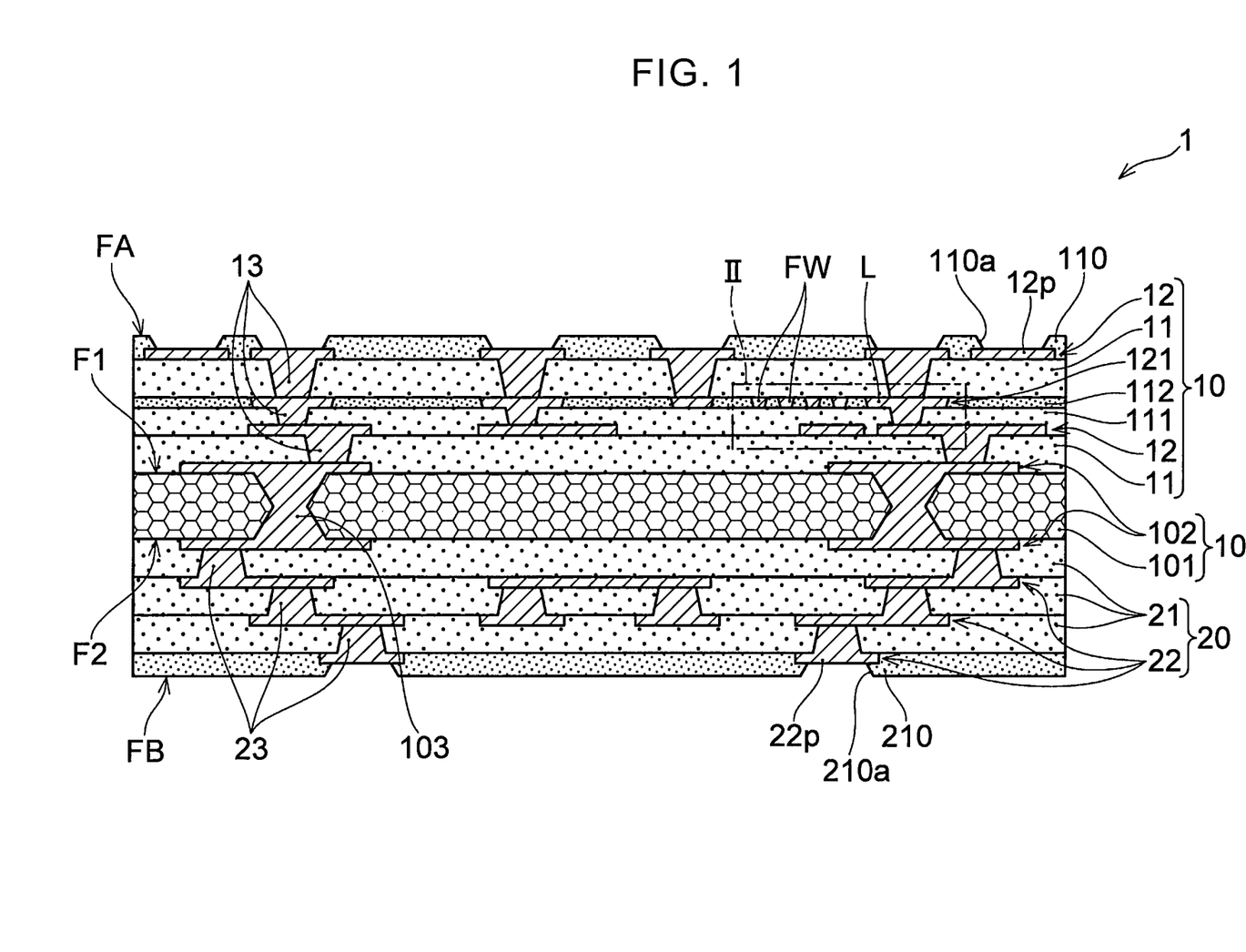
FIG. 1 is a cross-sectional view illustrating an example of a wiring substrate according to an embodiment of the present invention.

A wiring substrate according to an embodiment of the present invention is described with reference to the drawings. The drawings to be referenced below are drawn such that features according to embodiments of the present invention are easily understood, without intending to show exact proportions of structural elements. FIG. 1 illustrates a cross-sectional view of a wiring substrate 1 as an example of a structure that a wiring substrate according to an embodiment of the present invention has.

As illustrated in FIG. 1, the wiring substrate 1 includes a core substrate 100 that includes an insulating layer (core insulating layer) 101 and conductor layers (core conductor layers) 102 formed on both sides of the core insulating layer 101. On each of both sides of the core substrate 100, insulating layers and conductor layers are laminated. In the illustrated example, a first build-up part 10 in which insulating layers (11, 111, 112) and conductor layers (12, 121) are laminated is formed on a surface (F1) on one side of the core substrate 100. Further, a second build-up part 20 in which insulating layers 21 and conductor layers 22 are laminated is formed on a surface (F2) on the other side of the core substrate 100.

In the description of the wiring substrate of the present embodiment, a side farther from the core insulating layer 101 is referred to as "upper," "upper side," "outer side," or "outer," and a side closer to the core insulating layer 101 is referred to as "lower," "lower side," "inner side," or "inner." Further, for the insulating layers and the conductor layers, a surface facing the opposite side with respect to the core substrate 100 is also referred to as an "upper surface," and a surface facing the core substrate 100 side is also referred to as a "lower surface." Therefore, for example, in the description of the structural elements of the first build-up part 10 and the second build-up part 20, a side farther from the core substrate 100 is also referred to as an "upper side," "upper-layer side," or "outer side," or simply "upper" or "outer," and a side closer to the core substrate 100 is also referred to as a "lower side," "lower-layer side," or "inner side," or simply "lower" or "inner."

For example, an insulating layer 110, which is a solder resist layer, is formed on the first build-up part 10. For example, an insulating layer 210, which is a solder resist layer, is formed on the second build-up part 20. Openings (110a) are formed in the insulating layer 110, and conductor pads (12p) of the outermost conductor layer 12 in the first build-up part 10 are exposed from the openings (110a). Openings (210a) are formed in the insulating layer 210, and conductor pads (22p) of the outermost conductor layer 22 in the second build-up part 20 are exposed from the openings (210a).

An outermost surface of the wiring substrate 1 formed of exposed surfaces of the conductor layer 12 (conductor pads (12p)) and the insulating layer 110 is referred to as a first surface (FA). An outermost surface of the wiring substrate 1 formed of exposed surfaces of the insulating layer 210 and the conductor layer 22 (conductor pads (22p)) is referred to as a second surface (FB). That is, the wiring substrate 1 has the first surface (FA) and the second surface (FB) on the opposite side with respect to the first surface (FA) as two surfaces that extend in a direction orthogonal to a thickness direction of the wiring substrate 1.

In the insulating layer 101 of the core substrate 100, through-hole conductors 103 are formed connecting the conductor layer 102 that forms the surface (F1) on the one side of the core substrate 100 and the conductor layer 102 that forms the surface (F2) on the other side of the core substrate 100. In the insulating layers (11, 111, 21), via conductors (13, 23) connecting the conductor layers sandwiching the insulating layers (11, 111, 21) are formed.

The conductor layer 121 in the first build-up part 10 of the illustrated wiring substrate 1 has a structure different from the other conductor layers (102, 12, 22) forming the wiring substrate 1. Specifically, the conductor layers (102, 12, 22) are in a form in which side surfaces and upper surfaces of conductor patterns are covered by the insulating layers (11, 111, 110, 21, 210) covering upper sides of the conductor layers (102, 12, 22). The conductor layer 121 has a structure different from these conductor layers (102, 12, 22). An upper surface of the conductor layer 121 is in contact with the insulating layer 11 and a side surface of the conductor layer 121 is in contact with the insulating layer 112. In other words, the conductor layer 121 is in a form of being embedded in the insulating layer 112. Further, the conductor layer 121 penetrates the insulating layer 112 in the thickness direction, and a lower surface of the conductor layer 121 is in contact with the insulating layer 111. That is, the conductor layer 121 is in a form of penetrating the insulating layer 112 in the thickness direction, and has a thickness substantially equal to that of the insulating layer 112. In the present specification, a conductor layer (such as the conductor layer 121) that is in a form of being embedded in an insulating layer and penetrates the insulating layer and has a thickness substantially equal to that of the insulating layer is referred to as a "penetrating conductor layer" for the sake of description.

The conductor layers (102, 12, 121, 22), the via conductors (13, 23), and the through-hole conductors 103 may be formed using a metal such as copper or nickel, and, for example, may be formed of a metal foil such as a copper foil and/or a metal film formed by plating or sputtering or the like. The conductor layers (102, 12, 121, 22), the via conductors (13, 23), and the through-hole conductors 103 are illustrated in FIG. 1 as having a single-layer structure, but may have a multilayer structure that includes two or more metal layers. For example, each of the conductor layers 102 that are respectively formed on the surfaces of insulating layer 101 has a three-layer structure including a metal foil, an electroless plating film, and an electrolytic plating film. Further, each of the conductor layers (12, 121, 22), the via conductors (13, 23), and the through-hole conductors 103 has, for example, a two-layer structure including an electroless plating film and an electrolytic plating film.

Each of the conductor layers (102, 12, 121, 22) of the wiring substrate 1 is patterned to have predetermined conductor patterns. In particular, in the illustrated example, as will be described later, the conductor layer 121 is formed to have relatively fine patterns by filling recesses penetrating the insulating layer 112 formed on an outer side of the insulating layer 111. Specifically, the conductor layer 121 has wirings (FW) as relatively fine patterns. Further, the conductor layer 121 also has land parts (L) as connecting parts to the via conductors 13 that connect to an outer side of the conductor layer 121.

In the following description, the insulating layer 111 is also referred to as the first resin insulating layer 111, the insulating layer 112 is also referred to as the second resin insulating layer 112, and the conductor layer 121 is also referred to as the first conductor layer 121. The wiring substrate of the present embodiment includes at least the first resin insulating layer 111, the second resin insulating layer 112 that is laminated on an upper surface of the first resin insulating layer 111, and the first conductor layer 121 that penetrates the second resin insulating layer 112 and has a thickness substantially equal to that of the second resin insulating layer 112.

The outermost conductor layer 12 of the first build-up part 10 is formed to have patterns including the conductor pads (12p). The conductor pads (12p) are formed such that a component (not illustrated in the drawings) to be mounted on the wiring substrate 1 when the wiring substrate 1 is used can be placed. That is, the conductor pads (12p) are component mounting pads to be used as connecting parts when an external component is mounted on the wiring substrate 1, and the first surface (FA) of the wiring substrate 1 is a component mounting surface on which a component can be mounted. Electrodes of an electronic component can be electrically and mechanically connected to the component mounting pads (conductor pads) (12p), for example, via a bonding material (not illustrated in the drawings) such as solder. Examples of components that are mounted on the wiring substrate 1 include electronic components such as active components such as semiconductor integrated circuit devices and transistors.

The second surface (FB), which is a surface on the opposite side with respect to the first surface (FA) of the wiring substrate 1 in the example of FIG. 1, is a connection surface that is to be connected to an external wiring substrate, for example, an external element such as a motherboard of an electrical device when the wiring substrate 1 itself is mounted on the external element. Further, similarly to the first surface (FA), the second surface (FB) may be a component mounting surface on which an electronic component such as a semiconductor integrated circuit device is mounted. Without being limited to these, the conductor pads (22p) forming the second surface (FB) can be connected to a substrate, an electrical component, a mechanism element, or the like.

Each of the insulating layers (101, 11, 111, 112, 21) may be formed, for example, using an insulating resin such as an epoxy resin, a bismaleimide triazine resin (BT resin) or a phenol resin. For example, each of the insulating layers (110, 210), which are solder resist layers, may be formed using, for example, a photosensitive epoxy resin or polyimide resin, or the like. Each of the insulating layers (101, 11, 111, 112, 21, 110, 210) may contain an inorganic filler such as silica, or alumina. Each of the insulating layers (101, 11, 111, 21) may also contain a reinforcing material (core material) such as a glass fiber.

As will be described in detail later, the second resin insulating layer 112 in which the first conductor layer 121 is embedded, and the first resin insulating layer 111 may have different filler volume content rates. Specifically, the filler volume content rate of the second resin insulating layer 112 may be smaller than the filler volume content rate of the first resin insulating layer 111. Furthermore, an average particle size of the filler contained in the second resin insulating layer 112 may be smaller than an average particle size of the filler contained in the first resin insulating layer 111. When the fillers contained in the first resin insulating layer 111 and the second resin insulating layer 112 have the above relations, as will be described later regarding a method for manufacturing a wiring substrate, it may be possible that the formation of the first conductor layer 121 in a form of a penetrating conductor layer is more precisely performed.

Further, the fillers contained in the first resin insulating layer 111 and the second resin insulating layer 112 have the above relations, it may be possible that undesirable short circuit or insulation or the like in the wirings (FW) or the like of the first conductor layer 121 is suppressed. When the recesses in the second resin insulating layer 112 are formed in a process of forming the first conductor layer 121, it may be possible that filler particles contained in the second resin insulating layer 112 are exposed in the recesses. It may be possible that the filler particles exposed in the recesses protrude to inner sides of the recesses, and as a result, cause a local increase in impedance in the wiring patterns of the first conductor layer 121. Further, it may also be possible that the filler particles exposed in the recesses fall off during a desmear treatment in the recesses, and filler loopholes are formed in the second resin insulating layer 112. It may also be possible that the filler loopholes are filled with a conductor and distances between adjacent wirings are reduced and a risk of a short circuit is increased.

In particular, the relatively fine wirings (FW) in the first conductor layer 121 are likely to be affected by such filler particles, and this can lead to poor transmission of signals carried by the wirings (FW). The larger the number of filler particles exposed in the recesses, and the larger the relative sizes of the filler particles exposed in the recesses, the more pronounced this problem can become. Therefore, when the volume content rate and the average particle size of the filler in the second resin insulating layer 112 are smaller than the volume content rate and the average particle size of the filler in the first resin insulating layer 111, it may be possible that occurrence of the problem is suppressed.

Figure 2:
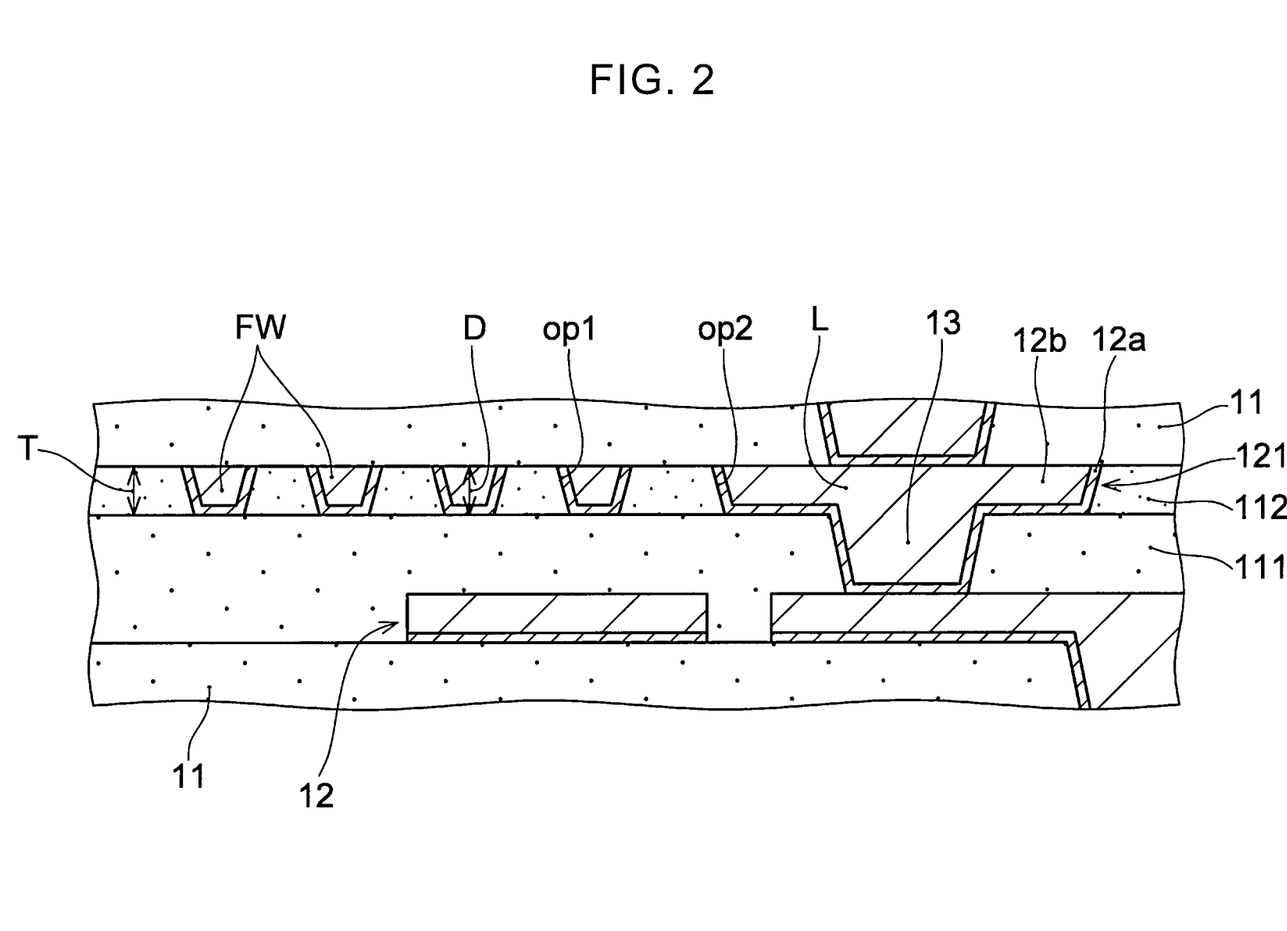
FIG. 2 is a partial enlarged view of FIG. 1, which is an example of the wiring substrate according to the embodiment of the present invention.

Next, with reference to FIG. 2, the structures of the first conductor layer 121 in a form of a penetrating conductor layer, the second resin insulating layer 112 penetrated by the first conductor layer 121, and the first resin insulating layer 111 as an insulating layer directly below the second resin insulating layer 112 are described in detail. FIG. 2 is an enlarged view of a region that is indicated by a reference numeral symbol "II" and is surrounded by a one-dot chain line in the cross-sectional view of FIG. 1, and includes the first resin insulating layer 111, the second resin insulating layer 112, and the first conductor layer 121. In the example illustrated in FIG. 2, each of the conductor layer 12 and the via conductors 13 has a two-layer structure including a metal film layer (electroless plating film layer) (12a) and an electrolytic plating film layer (12b), and the first conductor layer 121 is similarly formed of a metal film layer (12a) and an electrolytic plating film layer (12b).

The first conductor layer 121 penetrates the second resin insulating layer 112 and is in contact with both the insulating layer 11 and the first resin insulating layer 111 which are respectively in contact with an upper side and a lower side of the second resin insulating layer 112. The first conductor layer 121 has a two-layer structure including the metal film layer (12a), which covers inner surfaces of recesses (op1, op2) formed in the second resin insulating layer 112, and the electrolytic plating film layer (12b), which fills an inner side of the metal film layer (12a). Specifically, as will be described later in the description of the method for manufacturing a wiring substrate, the recesses (op1, op2) are formed by irradiating laser from an upper side of the second resin insulating layer 112. The recesses (op1, op2) penetrating the second resin insulating layer 112 in the thickness direction are formed in the second resin insulating layer 112 by removing a resin component by ablation by laser irradiation. The recesses (op1) correspond to the wirings (FW) that the first conductor layer 121 have, and the recesses (op2) correspond to the land parts (L).

Specifically, as will be described later regarding the method for manufacturing the wiring substrate, the second resin insulating layer 112 and the first resin insulating layer 111 are different from each other in processability (machinability) with respect to laser irradiation, and when laser penetrates the second resin insulating layer 112 and reaches the upper surface of the first resin insulating layer 111, the laser processing is substantially stopped. Therefore, a depth (D) of the recesses (op1, op2) is substantially the same as a thickness (T) of the second resin insulating layer 112. Specifically, the thickness (T) of the second resin insulating layer 112 is about 10 μm-20 μm, and the first conductor layer 121 is formed to have substantially the same thickness. The laser processability of each of the resin insulating layers (the second resin insulating layer 112 and the first resin insulating layer 111) is controlled by adjusting an absorbance coefficient with respect to the laser or a content rate of the filler contained or the like. The depth (D) of the recesses (op1, op2) may be larger than the thickness (T) of the second resin insulating layer 112, and bottoms of the recesses (op1, op2) may be formed protruding to the first resin insulating layer 111 side from an interface between the first resin insulating layer 111 and the second resin insulating layer 112.

In the cross-sectional view of FIG. 2, the wirings (FW), which are illustrated as multiple (4 in the illustrated example) wirings extending in parallel in a direction perpendicular to the paper (that is, from a front side to a back side of the page), are formed with relatively small line widths and inter-line distances. For example, the wirings (FW) have a smallest line width and a smallest inter-line distance of about 2 μm-5 μm. As described above, it may be preferable, especially from a point of view of suppressing a short circuit and insulation in the wirings (FW), that the volume content rate and average particle size of the filler contained in the second resin insulating layer 112 are smaller than the volume content rate and average particle size of the filler contained in the first resin insulating layer 111.

Specifically, from a point of view of suppressing a short circuit and a disconnection of the wirings (FW) and allowing each of the first and second resin insulating layers (111, 112) to have a desirable laser processability, for example, the volume content rate of the filler in the second resin insulating layer 112 is about 5%-15%, and the volume content rate of the filler in the first resin insulating layer 111 is about 50%-80%. Further, the average particle size of the filler contained in the second resin insulating layer 112 is about 0.25 μm, and the average particle size of the filler contained in the first resin insulating layer 111 is about 0.5 μm. Further, in particular, from a point of view of suppressing a short circuit and insulation in the wirings (FW), a maximum particle size of the filler contained in the second resin insulating layer 112 is preferably equal to or less than a predetermined ratio with respect to the line width and inter-line distance of the wirings (FW). For example, the maximum particle size of the filler contained in the second resin insulating layer 112 is 50% or less of the line width and inter-line distance of the relatively fine wirings (FW).

In the above, the wiring substrate 1 is described above as an example in which only one first conductor layer 121 in a form of a penetrating conductor layer is formed in the first build-up part 10. However, any number of penetrating conductor layers may be formed at any positions within a wiring substrate. For example, also in the second build-up part 20, a penetrating conductor layer may be formed as a conductor layer of the same rank as the first conductor layer 121. The term "rank" is a number assigned to each conductor layer when the number that increases by 1 for each layer starting from the core substrate 100 side is sequentially assigned starting from 1 to each of the multiple conductor layers laminated in each of the first build-up part 10 and the second build-up part 20. By forming in the second build-up part 20 a penetrating conductor layer with the same rank as that in the first build-up part 10, it may be possible that symmetricity in the thickness direction of the wiring substrate is improved and warpage of the wiring substrate is suppressed.

Figure 3A:
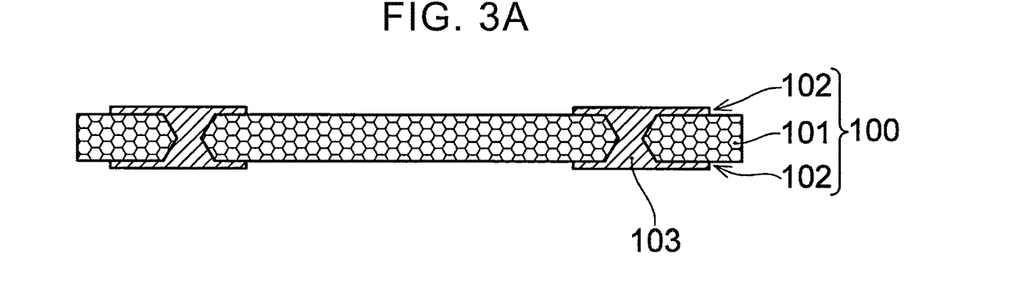
FIG. 3A is a cross-sectional view illustrating a method for manufacturing a wiring substrate according to an embodiment of the present invention.

With reference to FIGS. 3A-3J, a method for manufacturing a wiring substrate, which is an embodiment, is described using a case where the wiring substrate 1 illustrated in FIG. 1 is manufactured as an example. First, as illustrated in FIG. 3A, the core substrate 100 is prepared. In the preparation of the core substrate 100, for example, a double-sided copper-clad laminated plate including the core insulating layer 101 is prepared. Then, the core substrate 100 is prepared by using a subtractive method or the like to form the conductor layers 102 including predetermined conductor patterns on both sides of the insulating layer 101 and form the through-hole conductors 103 in the insulating layer 101.

Figure 3B:
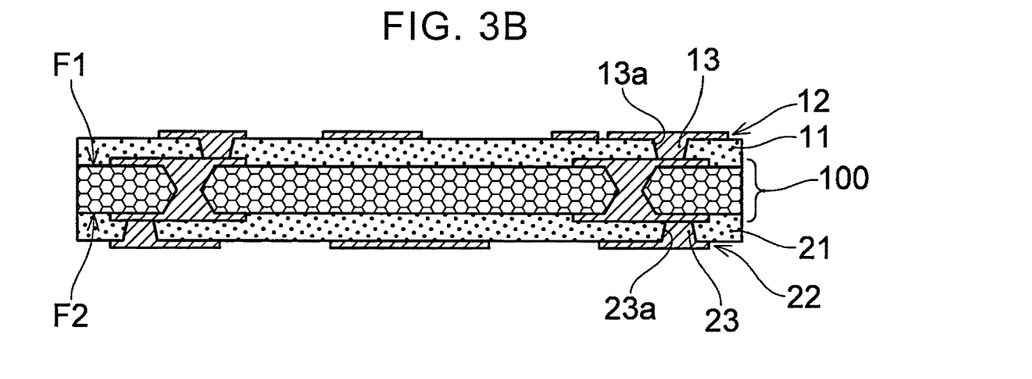
FIG. 3B is a cross-sectional view illustrating a method for manufacturing a wiring substrate according to an embodiment of the present invention.

Next, as illustrated in FIG. 3B, the insulating layer 11 is formed on the surface (F1) on one side of the core substrate 100, and the conductor layer 12 is laminated on the insulating layer 11. The insulating layer 21 is formed on the surface (F2) on the other side of the core substrate 100, and the conductor layer 22 is laminated on the insulating layer 21. For example, each of the insulating layers (11, 21) is formed by thermocompression bonding a film-like insulating resin onto the core substrate 100. The conductor layers (12, 22) are formed using a method for forming conductor patterns, such as a semi-additive method, at the same time as the via conductors (13, 23) filling openings (13a, 23a) that are formed in the insulating layers (11, 21), for example, using laser.

Figure 3C:
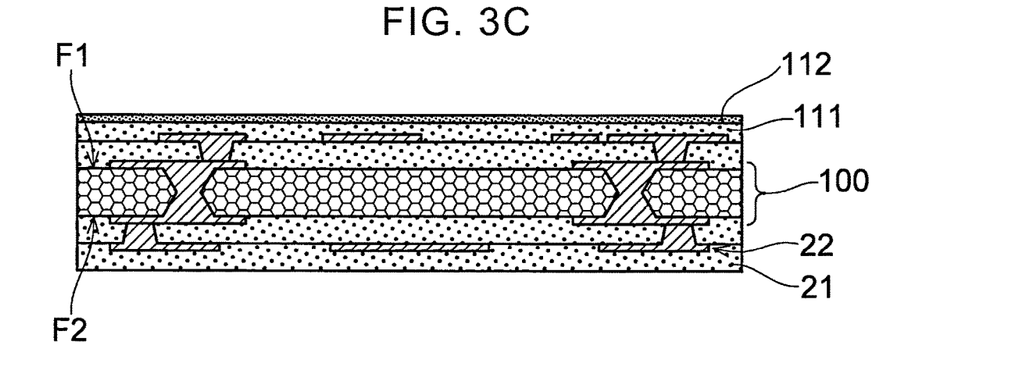
FIG. 3C is a cross-sectional view illustrating a method for manufacturing a wiring substrate according to an embodiment of the present invention.

Next, as illustrated in FIG. 3C, on the surface (F1) side of the core substrate 100, the first insulating layer 111 and the second insulating layer 112 are laminated. On the surface (F2) side, the insulating layer 21 is laminated on the conductor layer 22. The first resin insulating layer 111 and the second resin insulating layer 112 are formed using materials that are different in laser processability in forming the recesses in the second resin insulating layer 112 to be described later. The laser processability of each of the first and second resin insulating layers (111, 112) is adjusted, for example, depending on an amount of an additive (a curing accelerator and/or a curing inhibitor) and/or a volume content rate and an average particle size of filler contained, or the like.

Figure 3D:
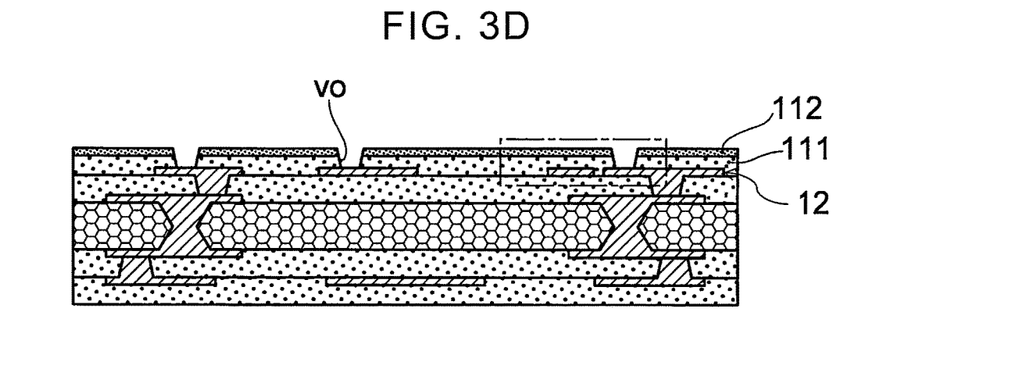
FIG. 3D is a cross-sectional view illustrating a method for manufacturing a wiring substrate according to an embodiment of the present invention.

Next, as illustrated in FIG. 3D, for example, by laser processing, openings (vo) are formed that continuously penetrate the second insulating layer 112 and the first resin insulating layer 111 to expose the conductor layer 12 at bottoms thereof. The openings (vo) are formed at positions where the via conductors 13 (see FIG. 1) penetrating the first insulating layer 111 are to be formed. For forming the openings (vo), for example, $CO_2$ laser with a relatively long wavelength of about 10 μm may be used.

Figure 3E:
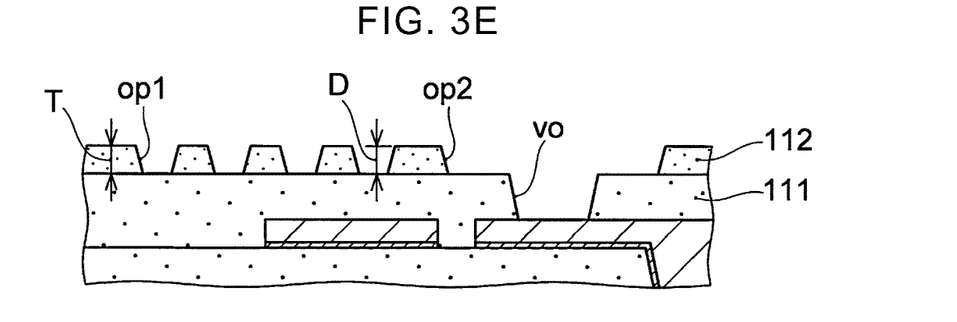
FIG. 3E is a partial enlarged view of a cross-sectional view illustrating a method for manufacturing a wiring substrate according to an embodiment of the present invention.
Figure 3F:
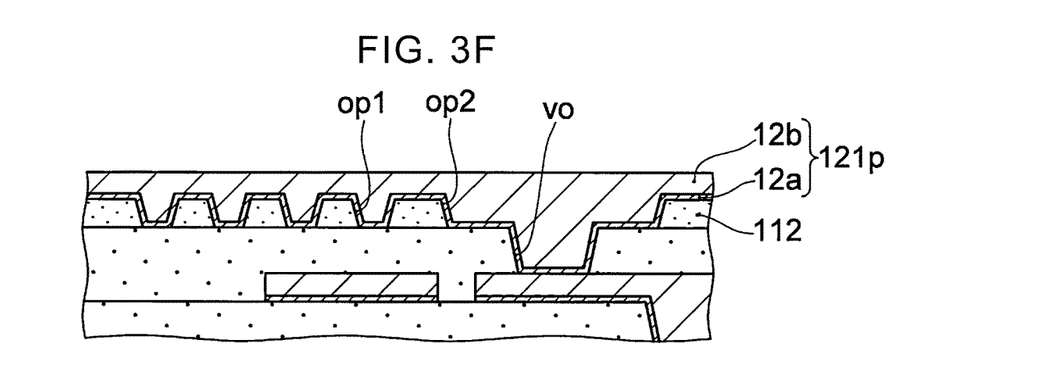
FIG. 3F is a partial enlarged view of a cross-sectional view illustrating a method for manufacturing a wiring substrate according to an embodiment of the present invention.
Figure 3G:
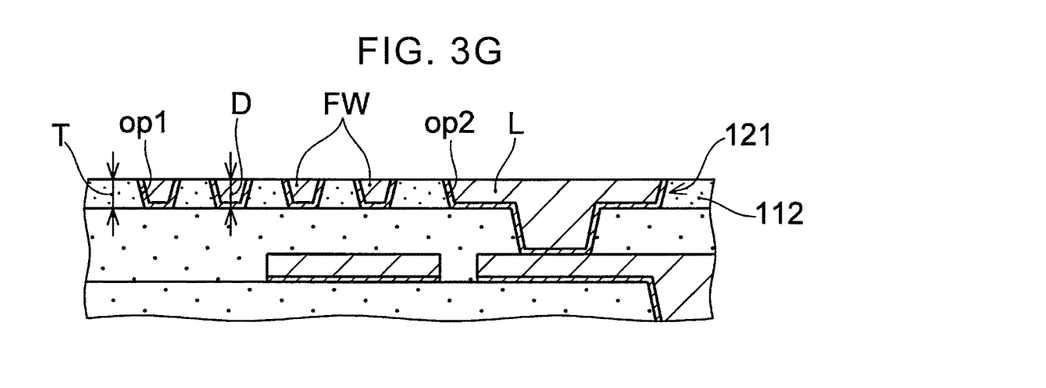
FIG. 3G is a partial enlarged view of a cross-sectional view illustrating a method for manufacturing a wiring substrate according to an embodiment of the present invention.

Next, as illustrated in FIG. 3E, the recesses (op1, op2) are formed in the second resin insulating layer 112. Each of FIGS. 3E-3G illustrates an enlarged view of a region corresponding to that of FIG. 2 near the first resin insulating layer 111, the second resin insulating layer 112, and the recesses (op1, op2) in a formation process of the wiring substrate 1.

For example, the recesses (op1, op2) that expose the first resin insulating layer 111 at bottoms thereof are formed by processing using excimer laser that has a relatively short wavelength and relatively excellent straightness in processing an insulating layer. The recesses (op1, op2) are formed according to the wiring patterns to be formed in the first conductor layer 121, which is formed penetrating the second resin insulating layer 112. As illustrated, the recesses (op1) correspond to the land parts (L) and the recesses (op2) correspond to the wirings (FW) of the first conductor layer 121 to be formed (see FIG. 1). Inner surfaces of the formed recesses (op1, op2) and openings (vo) may be subjected to a desmear treatment using a chemical solution containing an oxidizing agent such as permanganate.

In the formation of the recesses (op1, op2), the recesses (op1, op2) penetrating the second resin insulating layer 112 are drilled by ablation with laser such as excimer laser irradiated from an upper side of the second resin insulating layer 112. The second resin insulating layer 112 is formed using a material having a relatively high laser processability, and the first resin insulating layer 111 is formed using a material having a relatively low laser processability. Therefore, after the processing (drilling) with respect to the second resin insulating layer 112 by laser irradiation is completed and the first resin insulating layer 111 is exposed at the bottoms of the recesses (op1, op2), the first resin insulating layer 111 is substantially difficult to be processed by laser. For example, a certain time period is ensured before the first resin insulating layer 111 begins to be subjected to substantial processing. By stopping laser irradiation within that time period, the recesses (op1, op2) penetrating only the second resin insulating layer 112 are formed. In other words, the recesses (op1, op2) penetrating the second resin insulating layer 112 and having a depth (D) that is substantially the same as the thickness (T) of the second resin insulating layer 112 are realized by a difference in laser processability between the first resin insulating layer 111 and the second resin insulating layer 112. The depth (D) of the formed recesses (op1, op2) may be larger than the thickness (T) of the second resin insulating layer 112, and the bottoms of the recesses (op1, op2) may be formed protruding to the first resin insulating layer 111 side from the interface between the first resin insulating layer 111 and the second resin insulating layer 112.

The laser processability of a resin insulating layer is adjusted, for example, depending on an absorbance coefficient with respect to a wavelength of laser to be used. When the processability with respect to the wavelength of the laser is adjusted depending on the absorbance coefficient, the absorbance coefficient of the second resin insulating layer 112 is larger than the absorbance coefficient of the first resin insulating layer 111. For example, in order to make the absorbance coefficient of the second resin insulating layer 112 and the absorbance coefficient of the first resin insulating layer 111 different from each other with respect to laser, an amount of an additive that is contained in each of the second resin insulating layer 112 and the first resin insulating layer 111 is adjusted. An example of the additive is a curing inhibitor, which is a pigment such as carbon black. Further, the additive may be, for example, a curing accelerator such as imidazole, triphenylphosphine, a sulfonium salt, or the like.

Further, for example, it is also possible that a difference in laser processability is provided depending on compositions or structures of resin materials forming the second resin insulating layer 112 and the first resin insulating layer 111. For example, the second resin insulating layer 112 may be formed of an amorphous resin (such as an ABS resin), and the first resin insulating layer 111 may be formed of a crystalline resin (such as a liquid crystal polymer (LCP)).

Further, it is also possible that a difference in laser processability is provided by adjusting the volume content rate of the filler that is contained in the second resin insulating layer 112 and the first resin insulating layer 111. It may be possible that the higher the volume content rate of the filler, the more impeded the progress of laser processing in the thickness direction of the resin insulating layer. Therefore, it may be possible that the filler volume content rate of the second resin insulating layer 112 is relatively small, and the filler volume content rate of the first resin insulating layer 111 is relatively large. Further, a difference in laser processability is provided by providing a difference in average particle size between the fillers contained in the first and second resin insulating layers (111, 112). For example, by making the average particle size of the filler contained in the first resin insulating layer 111 larger than the average particle size of the filler contained in the second resin insulating layer 112, it may be possible that the laser machinability of the second resin insulating layer 112 is made higher than that of the first resin insulating layer 111. The term "particle size" in the description of filler particles means a linear distance between two most distant points on an outer surface of a filler particle. In the case where a difference in laser processability is provided by adjusting the filler volume content rates, when the first and second resin insulating layers (111, 112) are formed, for example, the second resin insulating layer 112 having a filler volume content rate of about 5%-15% and the first resin insulating layer 111 having a filler volume content rate of about 50%-80% are formed. Further, the average particle size of the filler in the second resin insulating layer 112 is about 0.25 μm, and the average particle size of the filler in the first resin insulating layer 111 is about 0.5 μm. Further, it may be possible that the maximum particle size of the filler contained in the second resin insulating layer 112 to be formed is limited to 50% or less of a width of each of the recesses (op1) to be formed and a width between adjacent recesses (op1).

The formation order of the openings (vo) and the recesses (op1, op2) described with reference to FIGS. 3D and 3E may be arbitrarily changed. For example, the recesses (op1, op2) may be formed prior to the formation of the openings (vo). After the lamination of first resin insulating layer 111 and the second resin insulating layer 112 illustrated in FIG. 3C and before the formation of the openings (vo) and the recesses (op1, op2), a surface of the insulating layer 21 exposed on the other surface (F2) side of the core substrate 100 is appropriately protected using a mask such as a PET film.

Next, as illustrated in FIG. 3F, a conductor layer (121p) is formed that covers the entire upper surface of the second resin insulating layer 112 and fills the recesses (op1, op2) and the openings (vo). For example, first, a metal film layer (12a) is formed by electroless plating or sputtering or the like. The metal film layer (12a) covers inner surfaces of the openings (vo) and the recesses (op1, op2) and the entire upper surface of the second resin insulating layer 112. Next, electrolytic plating is performed using the metal film layer (12a) as a power feeding layer, and a plating film layer (12b) is formed. An inner side of the metal film layer (12a) in the openings (vo) and the recesses (op1, op2) is filled with a conductor, and the conductor layer (121p) covering the entire upper surface of the second resin insulating layer 112 is formed.

Next, as illustrated in FIG. 3G, a portion of the conductor layer (121p) above the upper surface of the second resin insulating layer 112 in the thickness direction is removed by polishing. The polishing of the conductor layer (121p) is performed, for example, by chemical mechanical polishing (CMP). When the polishing is completed, the upper surface of the second resin insulating layer 112 and the upper surface of the first conductor layer 121 are substantially flush with each other.

As described above, the depth (D) of the recesses (op1, op2) formed penetrating the second resin insulating layer 112 is substantially equal to the thickness (T) of the second resin insulating layer 112. Therefore, the thickness of the first conductor layer 121 formed of the metal film layer (12a) and the plating film layer (12b) filling the recesses (op1, op2) is also substantially equal to the thickness (T) of the second resin insulating layer 112. That is, according to the method for manufacturing the wiring substrate of the present embodiment, controlling a thickness of a conductor layer embedded in a resin insulating layer is realized by controlling a thickness of the resin insulating layer. A thickness of a conductor layer in a form of being embedded in an insulating layer is precisely controlled.

Figure 3H:
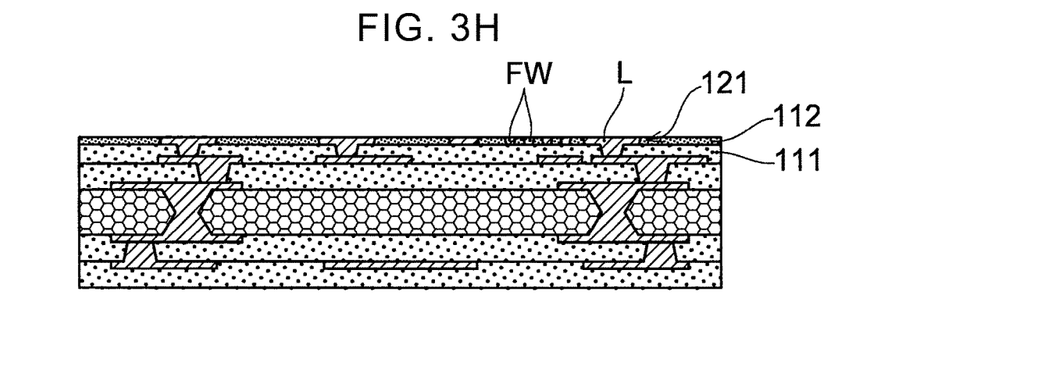
FIG. 3H is a cross-sectional view illustrating a method for manufacturing a wiring substrate according to an embodiment of the present invention.

Through the above processes, the wiring substrate is in a state as illustrated in FIG. 3H. The second resin insulating layer 121 is in a state of being exposed, and the formation of the first conductor layer 121 in a form of a penetrating conductor layer, which is embedded in the second resin insulating layer 112 and includes the wirings (FW) and the land parts (L), is completed.

Figure 3I:
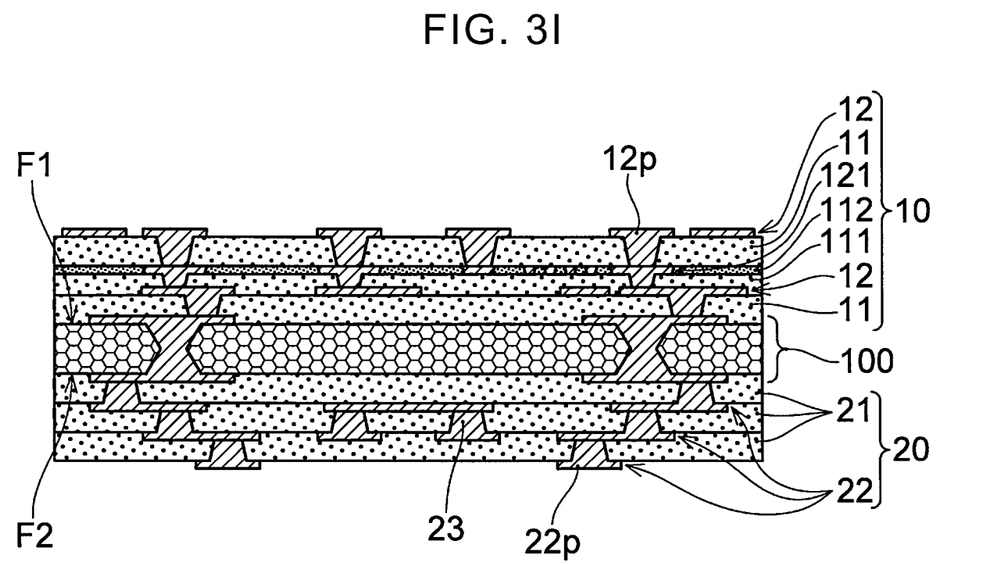
FIG. 3I is a cross-sectional view illustrating a method for manufacturing a wiring substrate according to an embodiment of the present invention.

Next, as illustrated in FIG. 3I, on the other surface (F2) side of the core substrate 100, the conductor layers 22 are integrally formed with the via conductors 23.

On the surface (F1) side of the core substrate 100, using the same method as the formation of the insulating layer 11 and the conductor layer 12 on the core substrate 100 described above, an insulating layer 11 and a conductor layer 12 are further formed on the upper side of the conductor layer 112. The formation of the first build-up part 10 on the surface (F1) side of the core substrate 100 is completed. On the other surface (F2) side of the core substrate 100, one insulating layer 21 and conductor layers 22 are further alternately laminated. The formation of the second build-up part 20 on the other surface (F2) side is completed. The outermost conductor layer 12 of the first build-up part 10 is formed to have patterns including the conductor pads (12p), and the outermost conductor layer 22 of the second build-up part 20 is formed to have patterns including the conductor pads (22p).

Figure 3J:
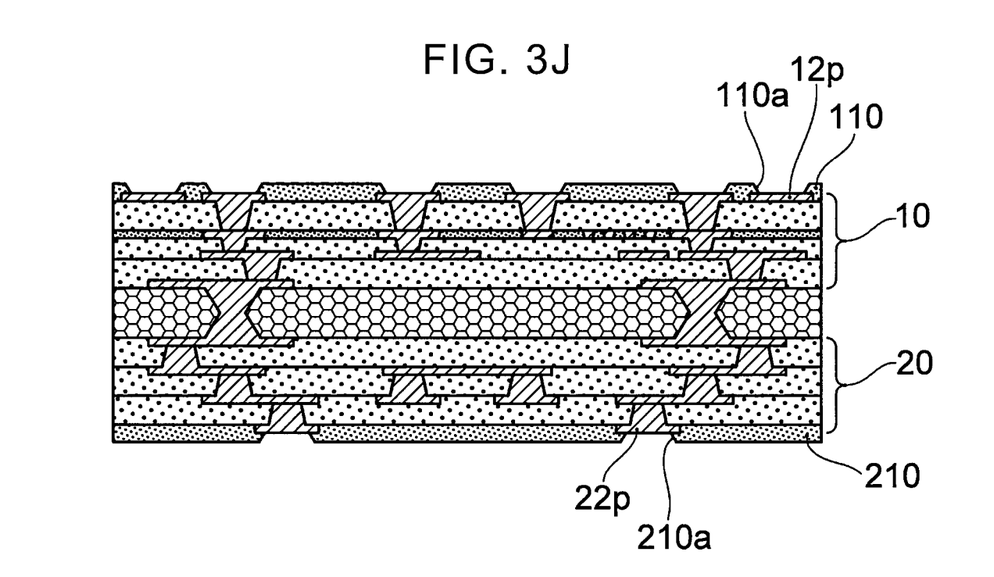
FIG. 3J is a cross-sectional view illustrating a method for manufacturing a wiring substrate according to an embodiment of the present invention.

Next, as illustrated in FIG. 3J, for example, the insulating layers (110, 210), which are solder resist layers, are respectively formed on the first and second build-up parts (10, 20). For example, photosensitive epoxy resin films are formed by spray coating, curtain coating, or film pasting, and the openings (110a, 210a) are formed by exposure and development. The conductor pads (12p, 22p) are exposed from the openings (110a, 210a) of the insulating layers (110, 210). By the above processes, the formation of the wiring substrate 1 is completed. After the formation of the openings (110a, 210a), a protective film (not illustrated in the drawings) may be formed on the exposed surface of each of the conductor pads (12p, 22p). For example, the protective film formed of Ni/Au, Ni/Pd/Au, Sn or the like may be formed by plating. An OSP film may be formed by spraying an organic material.

The wiring substrate of the embodiment is not limited to those having the structures illustrated in the drawings and those having the structures, shapes, and materials exemplified herein. For example, one or more conductor layers each in a form of a penetrating conductor layer are provided among the conductor layers forming the wiring substrate. The wiring substrate of the embodiment may have the first conductor layer in a form of a penetrating conductor layer, and the first resin insulating layer and the second resin insulating layer, and is not limited to a form of having a core substrate. Each of the first build-up part and the second build-up part may include any number of insulating layers and conductor layers. The number of insulating layers and conductor layers of the first build-up part and the number of insulating layers and conductor layers of the second build-up part formed on both sides of the core substrate may be different from each other. The method for manufacturing the wiring substrate of the present embodiment is not limited to the method described with reference to the drawings. Conditions, processing orders and the like of the method may be appropriately modified. Depending on a structure of an actually manufactured wiring substrate, some of the processes may be omitted, or other processes may be added.

International Publication No. 2010/004841 describes a print wiring substrate that includes a first insulating layer, a second insulating layer formed on the first insulating layer, a recess formed in the second insulating layer, and a second conductor circuit formed by filling the recess in the second insulating layer. The recess filled with a conductor forming the second conductor circuit is formed to have a depth less than a thickness of the second insulating layer by laser processing the second insulating layer.

In a method for manufacturing a printed wiring substrate described in International Publication No. 2010/004841, in the formation of the recess, it is necessary to stop the laser processing in the middle in a thickness direction of the second insulating layer. Therefore, it is thought that it is difficult to precisely control the depth of the recess. It is thought that it is difficult to precisely form the second conductor circuit, which is formed in the recess, to have a desired thickness.

A method for manufacturing a wiring substrate according to an embodiment of the present invention includes: forming a first resin insulating layer and a second resin insulating layer in contact with an upper surface of the first resin insulating layer; forming a recess penetrating the second resin insulating layer and exposing the first resin insulating layer at a bottom of the recess by irradiating laser; and forming a first conductor layer in a form of being embedded in the second resin insulating layer by filling the recess with a conductor. The first resin insulating layer and the second resin insulating layer are different from each other in processability with respect to the laser.

A wiring substrate according to an embodiment of the present invention includes: a first resin insulating layer; a second resin insulating layer formed in contact with an upper surface of the first resin insulating layer; and a recess penetrating the second resin insulating layer and exposing the first resin insulating layer at a bottom of the recess. The recess is filled with the first conductor layer.

According to an embodiment of the present invention, a wiring substrate in which a thickness of a conductor layer in a form of being embedded in an insulating layer is precisely controlled is provided.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a wiring substrate, comprising:

forming a second resin insulating layer on a first resin insulating layer such that the second resin insulating layer is in contact with a surface of the first resin insulating layer;

irradiating laser upon the second resin insulating layer such that a recess penetrating through the second resin insulating layer and exposing the first resin insulating layer is formed; and forming a conductor layer comprising conductor material filled in the recess formed through the second resin insulating layer such that the conductor layer is embedded in the second resin insulating layer, wherein the second resin insulating layer are formed on the surface of the first resin insulating layer such that the first resin insulating layer and the second resin insulating layer have different processability with respect to the laser and that an absorbance coefficient of the second resin insulating layer with respect to the laser is larger than an absorbance coefficient of the first resin insulating layer with respect to the laser, and the forming of the conductor layer includes forming a metal film layer on a surface of the second resin insulating layer in the recess and a surface of the first resin insulating layer at the bottom of the recess and forming a plating film layer on the metal film layer such that the plating film layer fills the recess.

2. The method for manufacturing a wiring substrate according to claim 1, wherein the forming of the conductor layer includes filling the recess with the conductor material and controlling a thickness of the conductor layer such that the thickness of the conductor layer becomes substantially equal to a depth of the recess and a thickness of the second resin insulating layer.

3. The method for manufacturing a wiring substrate according to claim 1, wherein the first resin insulating layer includes a curing accelerator such that a volume content rate of a curing accelerator in the second resin insulating layer is smaller than a volume content rate of the curing accelerator in the first resin insulating layer.

4. The method for manufacturing a wiring substrate according to claim 1, wherein the second resin insulating layer includes a curing inhibitor such that a volume content rate of the curing inhibitor in the second resin insulating layer is larger than a volume content rate of a curing inhibitor in the first resin insulating layer.

5. The method for manufacturing a wiring substrate according to claim 4, wherein the curing inhibitor is a pigment.

6. The method for manufacturing a wiring substrate according to claim 1, wherein the second resin insulating layer includes an amorphous resin, and the first resin insulating layer includes a crystalline resin.

7. The method for manufacturing a wiring substrate according to claim 1, wherein the first resin insulating layer includes an inorganic filler such that a volume content rate of the inorganic filler in the first resin insulating layer is larger than a volume content rate of an inorganic filler in the second resin insulating layer.

8. The method for manufacturing a wiring substrate according to claim 7, wherein the second resin insulating layer includes the inorganic filler such that an average particle size of the inorganic filler in the first resin insulating layer is larger than an average particle size of the inorganic filler in the second resin insulating layer.

9. The method for manufacturing a wiring substrate according to claim 1, wherein the irradiating of the laser comprises irradiating excimer laser.

10. The method for manufacturing a wiring substrate according to claim 1, wherein the forming of the conductor layer includes filling the recess with the conductor material and reducing a thickness of the conductor layer such that the thickness of the conductor layer becomes substantially equal to a depth of the recess and a thickness of the second resin insulating layer.

11. The method for manufacturing a wiring substrate according to claim 1, wherein the forming of the conductor layer includes filling the recess with the conductor material and polishing the conductor layer such that a thickness of the conductor layer becomes substantially equal to a depth of the recess and a thickness of the second resin insulating layer.

12. A wiring substrate, comprising:
a first resin insulating layer;
a second resin insulating layer formed on the first resin insulating layer such that the second resin insulating layer is in contact with a surface of the first resin insulating layer; and
a conductor layer comprising conductor material and formed in the second resin insulating layer such that the conductor layer is embedded in the second resin insulating layer,
wherein the second resin insulating layer has a recess penetrating through the second resin insulating layer and exposing the first resin insulating layer at a bottom of the recess such that the recess is filled with the conductor material of the conductor layer, the conductor material of the conductor layer includes a metal film layer and a plating film layer such that the metal film layer is formed on a surface of the second resin insulating layer in the recess and a surface of the first resin insulating layer at the bottom of the recess and that the plating film layer is formed on the metal film layer and filling the recess, and the second resin insulating layer is formed on the surface of the first resin insulating layer such that an absorbance coefficient of the second resin insulating layer with respect to laser is larger than an absorbance coefficient of the first resin insulating layer with respect to the laser.

13. The wiring substrate according to claim 12, wherein the conductor layer is formed such that a thickness of the conductor layer is substantially equal to a thickness of the second resin insulating layer.

14. The wiring substrate according to claim 12, wherein the second resin insulating layer is formed such that a volume content rate of an inorganic filler in the second resin insulating layer is smaller than a volume content rate of an inorganic filler in the first resin insulating layer.

15. The wiring substrate according to claim 12, wherein the first resin insulating layer includes a curing accelerator such that a volume content rate of a curing accelerator in the second resin insulating layer is smaller than a volume content rate of the curing accelerator in the first resin insulating layer.

16. The wiring substrate according to claim 12, wherein the second resin insulating layer includes a curing inhibitor such that a volume content rate of the curing inhibitor in the second resin insulating layer is larger than a volume content rate of a curing inhibitor in the first resin insulating layer.

17. The wiring substrate according to claim 16, wherein the curing inhibitor is a pigment.

18. The wiring substrate according to claim 12, wherein the second resin insulating layer includes an amorphous resin, and the first resin insulating layer includes a crystalline resin.

19. The wiring substrate according to claim 13, wherein the second resin insulating layer is formed such that a volume content rate of an inorganic filler in the second resin insulating layer is smaller than a volume content rate of an inorganic filler in the first resin insulating layer.

20. The wiring substrate according to claim 13, wherein the first resin insulating layer includes a curing accelerator such that a volume content rate of a curing accelerator in the second resin insulating layer is smaller than a volume content rate of the curing accelerator in the first resin insulating layer.

* * * * *